(12) United States Patent
Montmeat et al.

(10) Patent No.: US 11,088,010 B2
(45) Date of Patent: Aug. 10, 2021

(54) TEMPORARY BONDING METHOD WITH THERMOPLASTIC ADHESIVE INCORPORATING A RIGID RING

(71) Applicant: COMMISSARIAT À L'ÉNERGIE ATOMIQUE ET AUX ÉNERGIES ALTERNATIVES, Paris (FR)

(72) Inventors: Pierre Montmeat, Grenoble (FR); Frank Fournel, Grenoble (FR); Marc Zussy, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/570,296

(22) Filed: Sep. 13, 2019

(65) Prior Publication Data

US 2020/0090977 A1    Mar. 19, 2020

(30) Foreign Application Priority Data

Sep. 14, 2018   (FR) ...................... 1858323

(51) Int. Cl.
| H01L 21/30 | (2006.01) |
| H01L 21/46 | (2006.01) |
| H01L 21/28 | (2006.01) |
| H01L 21/44 | (2006.01) |
| H01L 29/06 | (2006.01) |
| H01L 21/78 | (2006.01) |

(Continued)

(52) U.S. Cl.
CPC ........ *H01L 21/6836* (2013.01); *H01L 21/304* (2013.01)

(58) Field of Classification Search
CPC ............. H01L 21/486; H01L 23/49816; H01L 23/5383; H01L 23/5384; H01L 45/1206; H05K 1/0271; H05K 1/115
See application file for complete search history.

(56) References Cited

U.S. PATENT DOCUMENTS

2002/0127821 A1*  9/2002  Ohya .................... C09J 7/10
                                                    438/459
2008/0044910 A1   2/2008  Hairault et al.
(Continued)

FOREIGN PATENT DOCUMENTS

WO      2016207702 A1   12/2016

OTHER PUBLICATIONS

Search Report for French Application No. FR1858323 dated Jul. 3, 2019.

*Primary Examiner* — Brian Turner
(74) *Attorney, Agent, or Firm* — Pearne & Gordon LLP

(57) ABSTRACT

A method for the temporary bonding of a substrate of interest to a handle substrate, comprising a step of forming an assembly by placing the bonding faces of the substrate of interest and of the handle substrate into contact with one another via a thermoplastic polymer, and a step of treating the assembly at a treatment temperature that exceeds the glass transition temperature of the thermoplastic polymer. Prior to the assembly forming step, this method comprises: a step of producing, at the bonding face of one of either the substrate of interest or the handle substrate, a central cavity surrounded by a peripheral ring made of a material that is rigid at the treatment temperature, and a step of forming a layer of the thermoplastic polymer filling the central cavity.

9 Claims, 8 Drawing Sheets

(51) Int. Cl.
*H01L 21/683* (2006.01)
*H01L 21/304* (2006.01)

(56) References Cited

U.S. PATENT DOCUMENTS

| | | |
|---|---|---|
| 2009/0095399 A1 | 4/2009 | Zussy et al. |
| 2012/0088352 A1 | 4/2012 | Beneyton et al. |
| 2013/0075365 A1 | 3/2013 | Fournel et al. |
| 2013/0078785 A1 | 3/2013 | Zussy et al. |
| 2013/0260471 A1 | 10/2013 | Caron et al. |
| 2013/0302983 A1 | 11/2013 | Tanabe et al. |
| 2014/0014618 A1 | 1/2014 | Fournel et al. |
| 2014/0084423 A1* | 3/2014 | Priewasser ............. H01L 21/78 257/619 |
| 2014/0110894 A1 | 4/2014 | Lee et al. |
| 2015/0348818 A1* | 12/2015 | Tachioka ................. B32B 9/04 156/247 |
| 2018/0158719 A1 | 6/2018 | Fournel et al. |
| 2018/0218997 A1 | 8/2018 | Fournel et al. |
| 2018/0350650 A1* | 12/2018 | Tanabe ....................... C09J 7/10 |
| 2018/0358261 A1 | 12/2018 | Beche et al. |

\* cited by examiner

TEMPORARY BONDING METHOD WITH THERMOPLASTIC ADHESIVE INCORPORATING A RIGID RING

TECHNICAL FIELD

The field of the invention is that of microelectronics, and more particularly that of the techniques used to create and handle thin wafers of semi-conductive material.

PRIOR ART

In various microelectronics methods, ultra-thin substrates must be formed and handled, the thickness whereof can in particular be less than 200 micrometres. However, these ultra-thin substrates are difficult to handle on production lines using standard tools. Moreover, depending on the nature of the materials used to form these ultra-thin substrates, they are sometimes so flexible that they coil around themselves when at rest, making the use thereof delicate.

To overcome these difficulties, and as shown in FIG. 1A-1G, a temporary bonding method is used to hold a substrate of interest 1 in place on a so-called handle substrate 2 by means of an adhesive layer 3. Once the substrate of interest is bonded to the handle substrate, it can be thinned to several tens of micrometres (FIG. 1D). The handle substrate enables the thinned substrate of interest 4 to be stiffened, handled using standard tools and allows technological steps to be carried out (FIG. 1E) on the thinned substrate of interest 4 in view of the manufacture of electronic components, such as depositions of various layers of materials.

Once the thinning and the technological steps have been carried out, the thinned substrate of interest 4 is separated from the handle substrate (FIG. 1F). This separation takes place in a conventional manner by a sequence of chemical and mechanical actions. Cleaning (FIG. 1G) is then carried out to remove the adhesive layer 3 from the thinned substrate of interest 4.

The adhesive layer 3 is generally made of a polymer which in particular encompasses the potential topography of the substrates to be assembled and enables the assembly of substrates having a high surface roughness with less restrictive and less expensive surface preparation and cleaning treatments for the substrates to be assembled.

The selected polymer is moreover generally a thermoplastic which, on the one hand, enhances the adhesion under the effect of a high-temperature treatment (generally less than 150° C.) and which, on the other hand, eases cleaning after separation from the handle substrate as a result of the solubility thereof.

However, the thinned substrate of interest is generally subjected to mechanical stresses resulting from the different layers of material deposited on the surface thereof during the technological steps. Yet, as soon as the assembly is heated above the glass transition temperature of the thermoplastic polymer (for example above about 100° C. for poly(methyl methacrylate), the polymer becomes rubber-like and very flexible, and the thinned substrate of interest will be able to release the stresses to which it is subjected by deformation. After the assembly has cooled, this deformation remains. FIGS. 2A and 2B thus show the geometrical configuration of the assembly respectively before and after heat treatment at a temperature that exceeds the glass transition temperature of the thermoplastic polymer 3.

It goes without saying that such a deformation hinders the subsequent technological steps. By way of example, this deformation can make a precise alignment for photolithography impossible or can deteriorate the performance of a planarisation step by polishing.

DESCRIPTION OF THE INVENTION

The purpose of the invention is to propose a temporary bonding method using a thermoplastic polymer adhesive that prevents, or at least reduces, such a deformation of the thinned substrate.

For this purpose, the invention relates to a method for the temporary bonding of a substrate of interest to a handle substrate, comprising:
  a step of assembly by placing bonding faces of the substrate of interest and of the handle substrate into contact with one another via a thermoplastic polymer,
  a step of treating the assembly at a treatment temperature that exceeds the glass transition temperature of the thermoplastic polymer.

Prior to the assembly step, this method comprises:
  a step of producing, at the bonding face of one of either the substrate of interest or the handle substrate, a central cavity surrounded by a peripheral ring having an upper level and a lower level, the peripheral ring being made of a material that is rigid at the treatment temperature, and
  a step of forming a layer of said thermoplastic polymer, said layer filling the central cavity once the assembly has taken place.

Some preferred, however non-limiting aspects of this method are as follows:
  the formation step is carried out such that, once the assembly has taken place, said layer extends above the upper level of the peripheral ring over the entire bonding face having the central cavity and the peripheral ring;
  the production step comprises thinning of a central part of one of either the substrate of interest or the handle substrate;
  the production step comprises the deposition of a band of said rigid material on a peripheral part of one of either the substrate of interest or the handle substrate;
  the production step comprises the formation of a layer of said rigid material on one of either the substrate of interest or the handle substrate and a thinning of a central part of the layer of said rigid material;
  the peripheral ring has a width that corresponds to at least 2.5%, preferably at least 5%, of the diameter of the bonding face of the substrate of interest;
  the rigid material has a Young's modulus greater than 1 MPa;
  it further comprises a step of trimming a peripheral part of the substrate of interest;
  it further comprises, after the assembly step, a step of thinning the substrate of interest and a step of separating the handle substrate from the thinned substrate of interest.

BRIEF DESCRIPTION OF THE FIGURES

Other aspects, purposes, advantages and features of the invention will be better understood upon reading the following detailed description given of the non-limiting preferred embodiments of the invention, provided for illustration purposes, with reference to the accompanying figures.

DETAILED DESCRIPTION OF SPECIFIC EMBODIMENTS

Figure 1A:
FIG. 1A-1G show a temporary bonding method used to hold a substrate of interest in place on a so-called handle substrate by means of an adhesive layer.
Figure 1B:
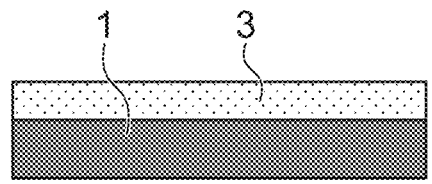
Figure 1C:
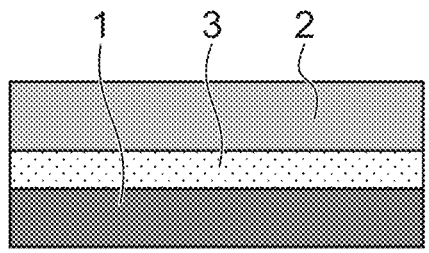
Figure 1D:
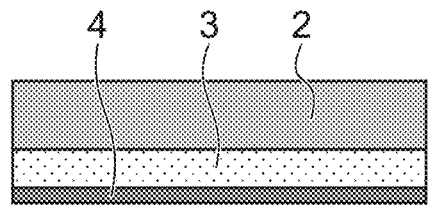
Figure 1E:
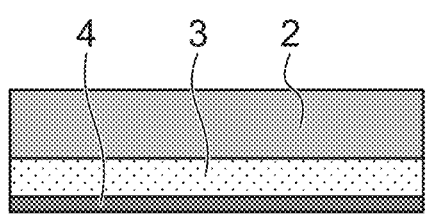
Figure 1F:
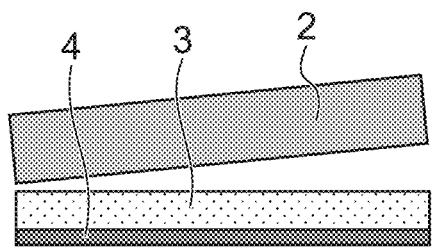
Figure 1G:
Figure 2A:
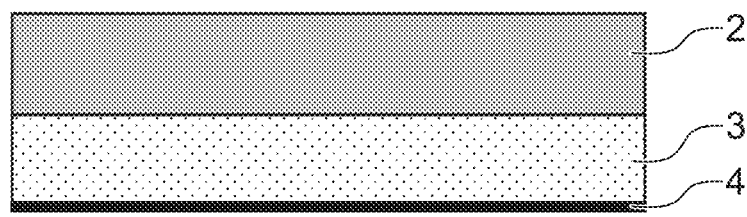
FIG. 2A-2B show as a geometrical configuration of the assembly respectively before and after heat treatment at a temperature that exceeds the glass transition temperature of the thermoplastic polymer.
Figure 2B:
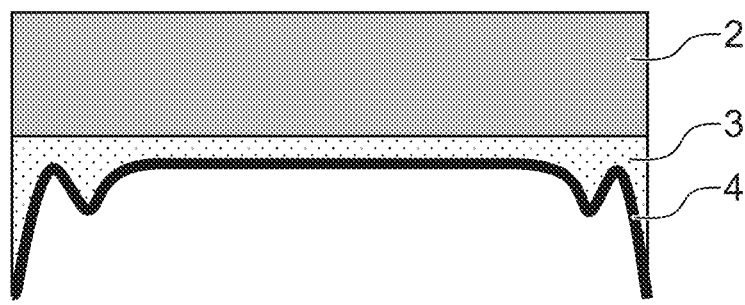

The invention relates to a method for the temporary bonding of a substrate of interest to a handle substrate (grip substrate) which follows the steps described hereinabove with reference to FIG. 1A-1G. In particular, this method comprises a step of assembly by placing bonding faces of the substrate of interest and of the handle substrate into contact with one another via a thermoplastic polymer, and by applying a heat treatment at a bonding temperature that exceeds the glass transition temperature of the thermoplastic polymer.

This method further comprises carrying out one or more technological steps on the assembly, and in particular a step of treating the assembly at a treatment temperature that exceeds the glass transition temperature of the thermoplastic polymer. It goes without saying that the method according to the invention can further comprise, after the assembly step, a step of thinning the substrate of interest and, after the step of treating the assembly, a step of separating the handle substrate from the thinned substrate of interest.

As previously stated, the treatment step taking place at a treatment temperature that exceeds the glass transition temperature of the thermoplastic polymer is capable of causing deformation of the thinned substrate of interest. In order to limit this effect, the invention proposes combining the thermoplastic polymer with a second material which retains high stiffness at a high temperature and more particularly at said assembly treatment temperature. By retaining the stiffness thereof during the assembly treatment step, this second material enables the thinned substrate of interest to be maintained while preventing the deformation thereof despite the then rubber-like form of the thermoplastic polymer. The phrase "material that is rigid at the treatment temperature" is understood to typically mean a material with a Young's modulus greater than 1 MPa.

For this purpose, the method according to the invention more particularly comprises, before the assembly step, a step of producing, at the bonding face of one of either the substrate of interest or the handle substrate, a central cavity surrounded by a peripheral ring having an upper level and a lower level, the peripheral ring being made of a material that is rigid at the treatment temperature. The peripheral ring can be arranged at the wafer edge (i.e. on the circumference of the bonding face on which it is formed) or it can be offset from the wafer edge by a distance corresponding to that trimmed from the substrate of interest so as to ultimately be located at the circumference of the trimmed substrate of interest.

The method according to the invention further comprises a step of forming a layer of said thermoplastic polymer which fills the central cavity.

In one possible embodiment, the formation step is carried out such that said layer fills the central cavity and extends, on the bonding face having the central cavity and the peripheral ring, above the upper level of the peripheral ring over the entire bonding face having the central cavity and the peripheral ring.

In another embodiment, the formation step is carried out such that said layer only fills the central cavity and the method comprises the formation of a layer made of said polymer on the bonding face of the other substrate.

In either of these embodiments, bonding is carried out solely with the thermoplastic polymer, including for bonding the peripheral ring. Vertically to the rigid peripheral ring, the thickness of the thermoplastic polymer is nonetheless reduced, which means that at a high temperature, in particular at the treatment temperature that exceeds the glass transition temperature of the thermoplastic polymer, the deformation of the thinned substrate of interest is significantly limited.

The peripheral ring made of a rigid material has a width that corresponds to at least 2.5%, preferably at least 5%, of the diameter of the bonding face of the substrate of interest (where appropriate the diameter thereof after trimming). In this manner, the peel forces that create a risk of the thinned substrate of interest becoming deformed are contained. For illustration purposes, the peripheral ring can be formed on a substrate of diameter 200 mm and have a width of 5 mm to 10 mm.

Figure 3A:
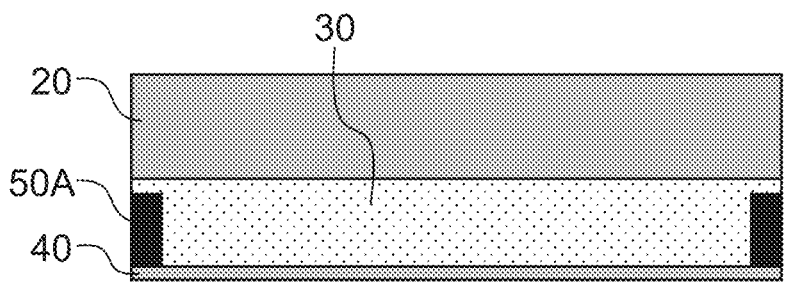
FIG. 3A-3D show different temporary assemblies of a thinned substrate of interest and of a handle substrate capable of being produced by different embodiments of the invention.

In either one of the embodiments described above, the method enables, after assembly of the substrates and thinning of the substrate of interest, the assemblies shown in FIG. 3A-3O to be obtained of the handle substrate 20 with the thinned substrate of interest 40 via the thermoplastic polymer 30 in which the peripheral ring 50A-50D made of rigid material is located. In these FIG. 3A-3D, the peripheral ring 50A-50D is arranged at the wafer edge.

Figure 3B:
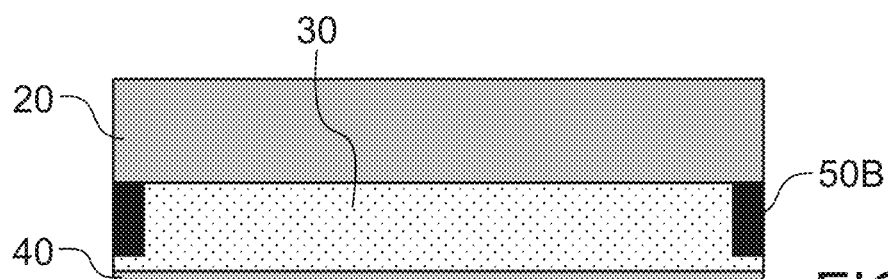
Figure 3C:
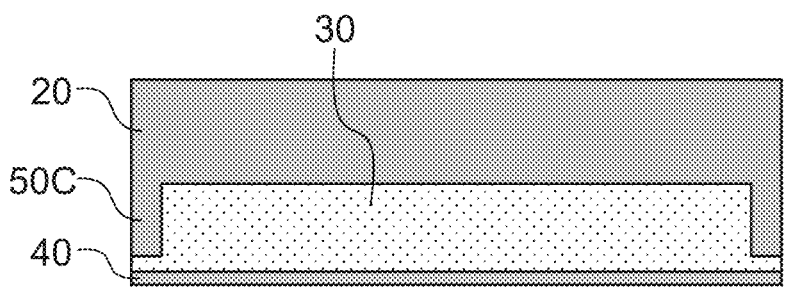
Figure 3D:
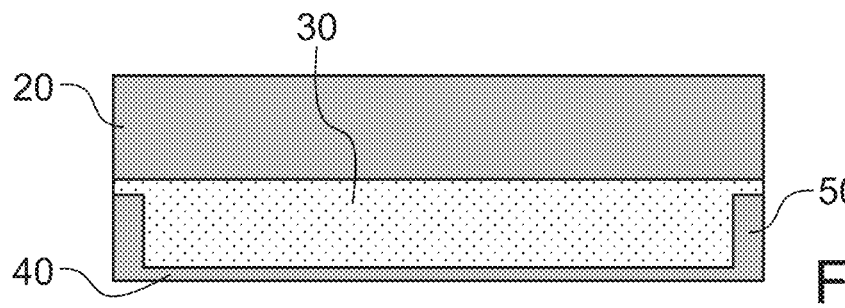

In FIGS. 3A and 3D, the peripheral ring 50A, 50D is formed on the bonding face of the substrate of interest. It can be fixed to this bonding face (FIG. 3A) and thus not necessarily be made of the same material as that of the substrate of interest, or it can be derived from a structuring of this bonding face (FIG. 3D) and thus be made of the same material as the substrate of interest.

In FIGS. 3B and 3C, the peripheral ring 50B, 50C is formed on the bonding face of the handle substrate 20. It can be fixed to this bonding face (FIG. 3B) and thus not necessarily be made of the same material as that of the handle substrate, or it can be derived from a structuring of this bonding face (FIG. 3C) and thus be made of the same material as the handle substrate.

If the rigid material is not identical to that of the substrate of interest or of the handle substrate (FIGS. 3A and 3B), the rigid material can advantageously be stressed so as to limit the effect of the stresses within the thinned substrate of interest. More specifically, if the thinned substrate of interest is subjected to stresses, the end structure can have a significant deflection. With a ring subjected to an opposite stress, the overall deflection of the structure can be minimised or even cancelled out.

FIGS. 4A-4B, 5A-5B and 6A-6C show different possible embodiments of the step of producing the central cavity and the peripheral ring on the bonding face of one of either the substrate of interest or the handle substrate and of the step of forming the bonding layer made of thermoplastic polymer.

Figures 4A, 4B:
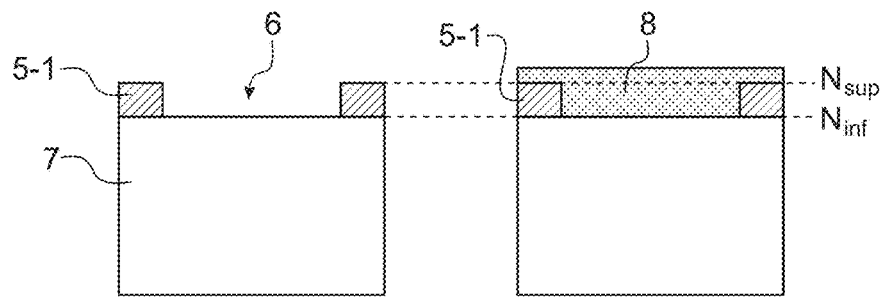
FIGS. 4A-4B, 5A-5B and 6A-6C show different alternative embodiments of the production and formation steps of the method according to the invention.

As shown in FIG. 4A, the production step can comprise the deposition of a band of said rigid material on a peripheral part of one of either the substrate of interest or the handle substrate. This band forms a peripheral ring 5-1 on the bonding face of the substrate 7, which ring delimits a central cavity 6. The peripheral ring has a lower level Ninf corresponding to the bottom of the central cavity and an upper level Nsup. As shown in FIG. 4B, the formation step is carried out such that the bonding layer 8 fills the central cavity and extends above the upper level Nsup of the peripheral ring 5-1 over the entire bonding face having the central cavity and the peripheral ring.

Figures 5A, 5B:
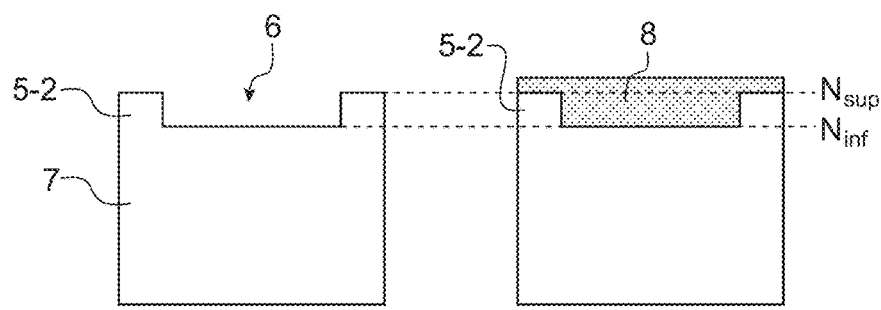

As shown in FIG. 5A, the production step can comprise a thinning of a central part of one of either the substrate of interest or the handle substrate, for example according to the Taiko process. This thinning forms, on the bonding face of the substrate 7, the central cavity 6 surrounded by the peripheral ring 5-2. The peripheral ring has a lower level Ninf corresponding to the bottom of the central cavity and an upper level Nsup. As shown in FIG. 5B, the formation step is carried out such that the bonding layer 8 fills the central cavity and extends above the upper level Nsup of the peripheral ring 5-2 over the entire bonding face having the central cavity and the peripheral ring.

Figures 6A, 6B, 6C:
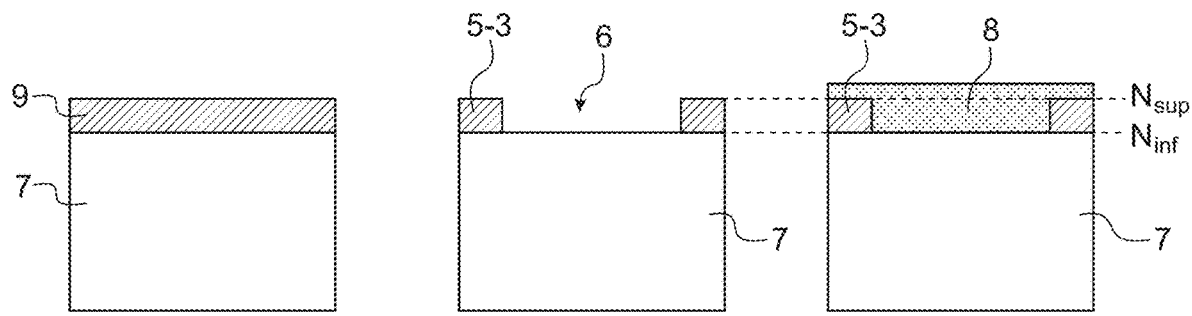

As shown in FIGS. 6A and 6B, the production step can comprise the formation of a layer 9 of said rigid material on one of either the substrate of interest or the handle substrate and a thinning of a central part of the layer of said rigid material, for example according to the Taiko process or by means of photolithography and ion etching. This thinning forms, on the bonding face of the substrate 7, the central cavity 6 surrounded by the peripheral ring 5-3. The peripheral ring has a lower level Ninf corresponding to the bottom of the central cavity and an upper level Nsup. As shown in FIG. 6C, the formation step is carried out such that the bonding layer 8 fills the central cavity and extends above the upper level Nsup of the peripheral ring 5-3 over the entire bonding face having the central cavity and the peripheral ring.

In one alternative embodiment of the invention, the method further comprises a step of trimming a peripheral part of the substrate of interest, carried out before or after the assembly step. The purpose of this trimming is to remove a large thickness from the periphery of the substrate of interest (of about 100 μm for a substrate of thickness 725 μm for example). Such a removal prevents the polymer from overhanging in the bonding machine. It also enables, after thinning of the substrate of interest, a thinned substrate of interest to be obtained that is less fragile, the edges whereof are precise, well defined and not too close to the edge of the structure.

In general, this trimming reduces the diameter of the bonding face by 2 to 10 mm. It goes without saying that if such a trimming of the substrate of interest is carried out, the ring of the invention must be arranged at the wafer edge and be wider than the reduction created by trimming, or be offset from the wafer edge by a distance corresponding to the reduction created by trimming so as to ultimately be located at the circumference of the trimmed substrate of interest.

FIGS. 7A-7E, 8A-8F, 9A-9D and 10A-10D show different alternative embodiments of the method according to the invention with trimming and thinning of the substrate of interest. In FIGS. 7A-7E and 8A-8F, trimming takes place before assembly, whereas in FIGS. 9A-9D and 10A-10D, trimming takes place after assembly.

Figure 7A:
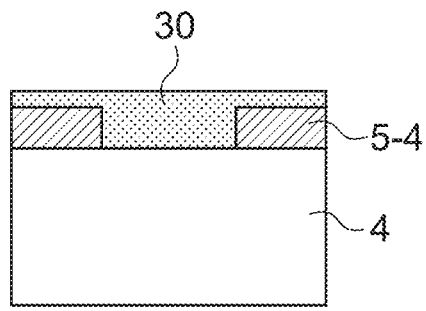
FIGS. 7A-7E, 8A-8F, 9A-9O and 10A-10D show different alternative embodiments of the method according to the invention with trimming and thinning of the substrate of interest.
Figure 7B:
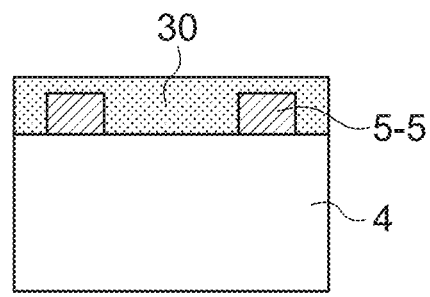
Figure 7C:
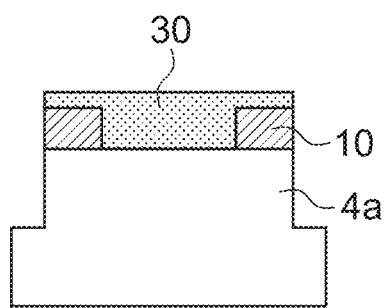
Figure 7D:
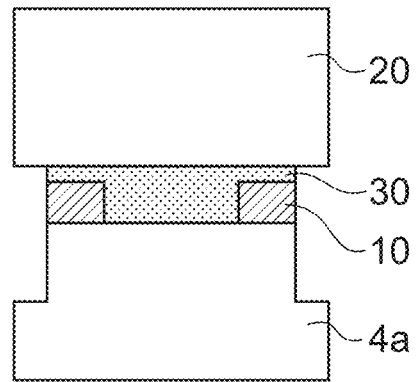
Figure 7E:
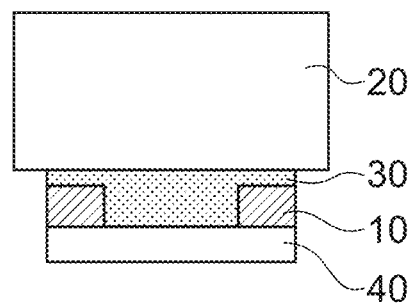

In the method shown in FIG. 7A-7E, the peripheral ring is made at the bonding face of the substrate of interest 4. This is a ring 5-4 at the wafer edge that is wider than the reduction created by trimming (FIG. 7A) or a ring 5-5 that is offset from the wafer edge by a distance corresponding to the reduction created by trimming (FIG. 7B). The trimming operation is then carried out, which procures a trimmed substrate of interest 4a with the rigid material of the ring 10 present at the circumference of the bonding face of the trimmed substrate of interest 4a (FIG. 7C). The handle substrate 20 (FIG. 7D) is then assembled therewith via the layer of thermoplastic polymer 30, and thinning takes place to obtain the thinned substrate of interest 40 (FIG. 7E).

Figure 8A:
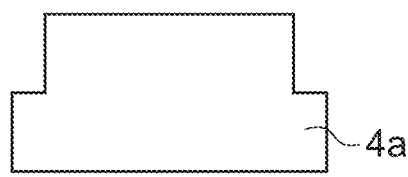
Figure 8B:
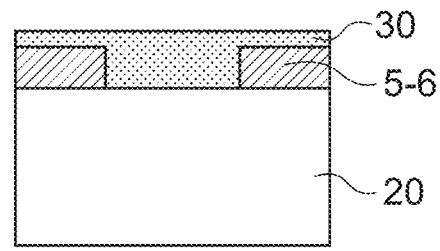
Figure 8C:
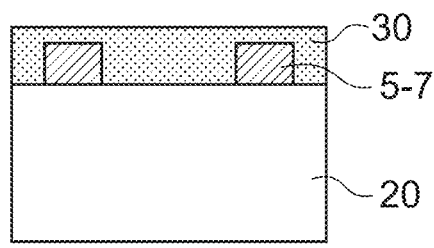
Figure 8D:
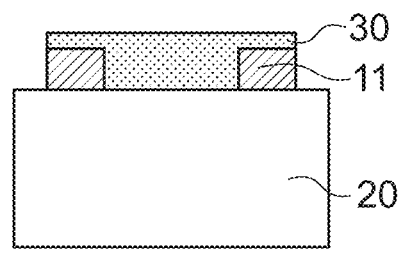
Figure 8E:
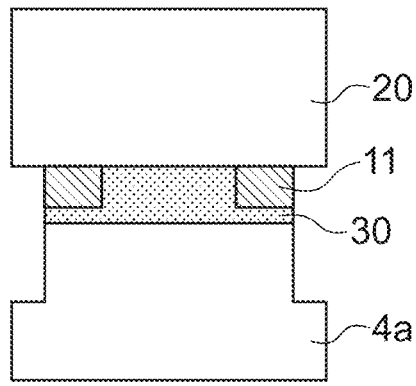
Figure 8F:
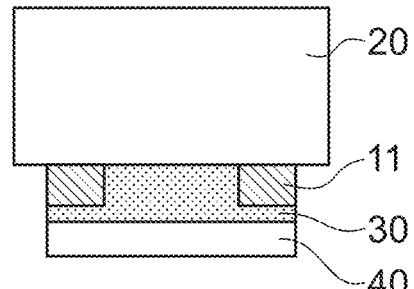

In the method shown in FIG. 8A-8F, a trimmed substrate of interest 4a is obtained (FIG. 8A). The peripheral ring is produced at the bonding face of the handle substrate 20. This is a ring 5-6 at the wafer edge that is wider than the reduction created by trimming (FIG. 8B) or a ring 5-7 that is offset from the wafer edge by a distance corresponding to the reduction created by trimming (FIG. 8C). A peripheral part of the bonding layer is removed over a distance corresponding to the trimming in order to bring the rigid material of the ring 11 flush (FIG. 8D). The trimmed substrate of interest 4a is then assembled therewith via the thermoplastic polymer layer 30, the rigid material of the ring 11 being present at the circumference of the bonding face of the trimmed substrate of interest 4a (FIG. 8E), and thinning is carried out to obtain the thinned substrate of interest 40 (FIG. 8F).

Figure 9A:
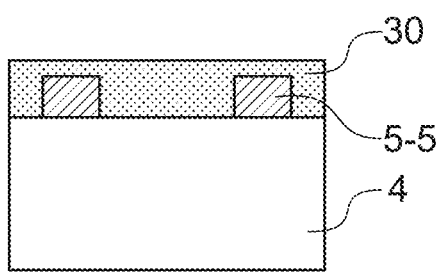
Figure 9B:
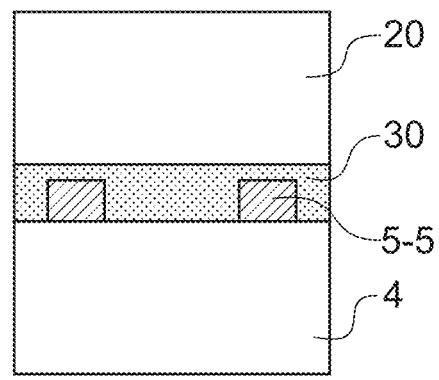
Figure 9C:
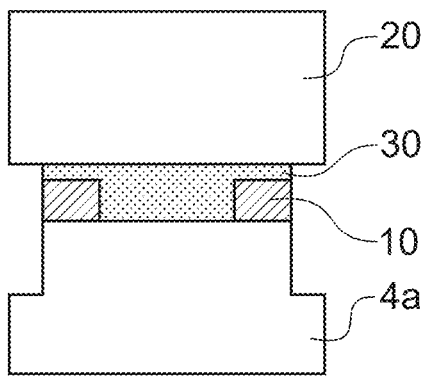
Figure 9D:
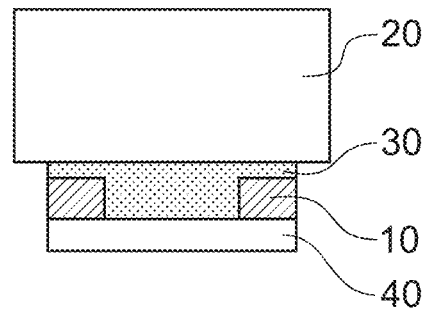

In the method shown in FIG. 9A-9D, the peripheral ring is made at the bonding face of the substrate of interest 4. This is a ring 5-5 that is offset from the wafer edge by a distance corresponding to the reduction created by trimming (FIG. 9A). It goes without saying that this could be a ring at the wafer edge, which ring is wider than the reduction created by trimming. The handle substrate 20 is then assembled therewith via the thermoplastic polymer layer 30 (FIG. 9B) before a trimming operation, which procures a trimmed substrate of interest 4a with the rigid material of the ring 10 present at the circumference of the bonding face of the trimmed substrate of interest 4a (FIG. 9C). Thinning is then carried out to obtain the thinned substrate of interest 40 (FIG. 9D).

Figure 10A:
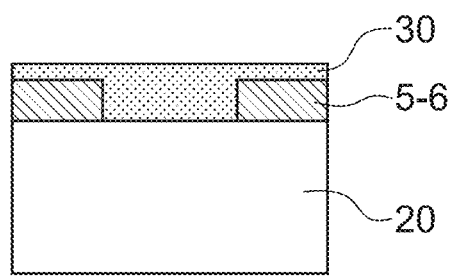
Figure 10B:
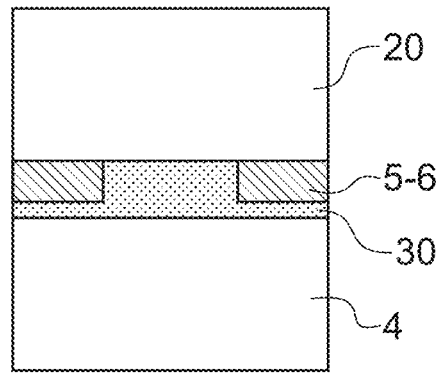
Figure 10C:
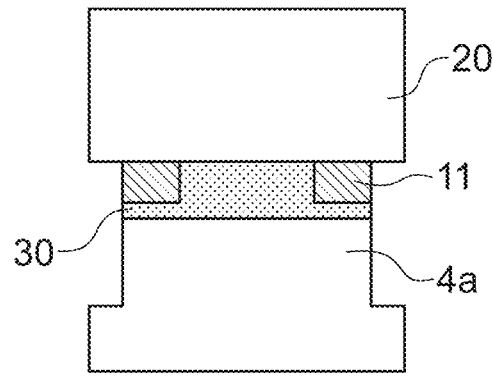
Figure 10D:
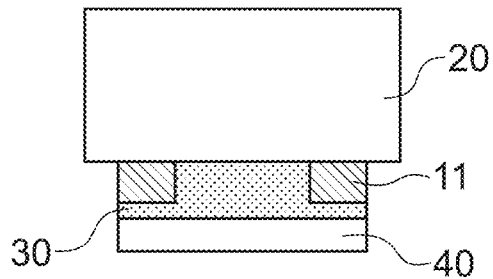

In the method shown in FIG. 10A-10D, the peripheral ring is made at the bonding face of the handle substrate 20. This is a ring 5-6 at the wafer edge, which ring is wider than the reduction created by trimming (FIG. 10A). It goes without saying that this could also be a ring that is offset from the wafer edge by a distance corresponding to the reduction created by trimming. The substrate of interest 4 is then assembled therewith via the thermoplastic polymer layer 30 (FIG. 10B) before a trimming operation, which procures a trimmed substrate of interest 4a with the rigid material of the ring 11 present at the circumference of the bonding face of the trimmed substrate of interest 4a (FIG. 10C). Thinning is then carried out to obtain the thinned substrate of interest 40 (FIG. 10D).

The paragraphs below present different example embodiments of the invention. In each of these examples, the thermoplastic polymer adhesive is the polymer marketed by Brewer Science under the trade name BrewerBOND® 305-30.

A first example embodiment complies with the method shown in FIGS. 4A and 4B. A band of a cross-linked polymer, the stiffness whereof varies little as a function of the temperature, for example the polymer SINR-3110 marketed by Shin Etsu Chemical, is deposited on the periphery of a substrate of interest made of silicon. The band has a width of 5 mm and a height of 20 µm. 25 µm of thermoplastic adhesive is then deposited on the substrate of interest. An anti-adhesion layer, generally a layer made of a fluorinated material, for example the material 3M™Novec™2702, is deposited on the surface of a silicon handle substrate. The two substrates are assembled at 200° C. under a vacuum and with a force of 6 kN. The substrate of interest is thinned to 100 µm by abrasion using a diamond wheel.

A second example embodiment complies with the method shown in FIGS. 5A and 5B. A silicon substrate of interest is treated via the TAIKO process to form therein a central cavity having a depth of 30 µm surrounded by a peripheral ring of width 5 mm. 35 µm of the thermoplastic adhesive is then deposited on the substrate of interest. An anti-adhesion layer, generally a layer made of a fluorinated material, for example the material 3M™Novec™2702, is deposited on the surface of a silicon handle substrate. The two substrates are assembled at 200° C. under a vacuum and with a force of 6 kN. The substrate of interest is thinned to 80 µm by abrasion using a diamond wheel. The TAIKO process enables the geometrical configuration of the central cavity and of the peripheral ring to be easily adapted: the central cavity can have a depth from 5 µm to several hundred micrometres and the peripheral ring can have a width from 5 mm to several tens of millimetres.

A third example embodiment complies with the method shown in FIG. 6A to 6C. A wafer made of fused silica is bonded to a substrate of interest made of silicon. The fused silica wafer is thinned by grinding to form a layer of thickness 30 µm. This layer is treated via the TAIKO process to form therein a central cavity having a depth of 30 µm surrounded by a peripheral ring of width 5 mm. 35 µm of the thermoplastic adhesive is then deposited on the substrate of interest. An anti-adhesion layer, generally a layer made of a fluorinated material, for example the material 3M™Novec™2702, is deposited on the surface of a silicon handle substrate. The two substrates are assembled at 200° C. under a vacuum and with a force of 6 kN. The substrate of interest is thinned to 80 µm by abrasion using a diamond wheel. During heat treatments carried out before final dismantling, the fused silica ring is tensioned and thus enables the deformations induced by possible stresses within the thinned substrate of interest to be limited.

A fourth example embodiment complies with the method shown in FIG. 6A to 6C. A silicon substrate is bonded to a silicon substrate of interest, the two substrates having different temperatures at the time of bonding: 25° C. and 100° C. The silicon wafer which was at 100° C. at the time of bonding is thinned by grinding to form a layer of thickness 30 µm. This layer is treated via the TAIKO process to form therein a central cavity having a depth of 30 µm surrounded by a peripheral ring of width 5 mm. 35 µm of the thermoplastic adhesive is then deposited on the substrate of interest. An anti-adhesion layer, generally a layer made of a fluorinated material, for example the material 3M™Novec™2702, is deposited on the surface of a silicon handle substrate. The two substrates are assembled at 200° C. under a vacuum and with a force of 6 kN. The substrate of interest is thinned to 80 µm by abrasion using a diamond wheel. During heat treatments carried out before final dismantling, the silicon ring is tensioned and thus enables the deformations induced by possible stresses within the thinned substrate of interest to be limited.

In a fifth example embodiment implementing the TAIKO process in a silicon handle substrate, a central cavity is made having a depth of 30 µm and a peripheral ring having a width of 5 mm. 35 µm of the thermoplastic adhesive is then deposited on the handle substrate. An anti-adhesion layer, generally a layer made of a fluorinated material, for example the material 3M™Novec™2702, is deposited on the surface of the substrate of interest. The two substrates are assembled at 200° C. under a vacuum and with a force of 6 kN. The substrate of interest is thinned to 150 µm by abrasion using a diamond wheel.

What is claimed is:

1. A method of temporary bonding of a substrate of interest to a handle substrate, comprising:
    a step of forming an assembly by placing bonding faces of the substrate of interest and of the handle substrate into contact with one another via a bonding layer made of a thermoplastic polymer having a glass transition temperature,
    a step of treating the formed assembly at a treatment temperature that exceeds the glass transition temperature of the thermoplastic polymer,
    wherein the method comprises, prior to the step of forming the assembly:
    a step of producing, at the bonding face of one of either the substrate of interest or the handle substrate, a central cavity surrounded by a peripheral ring having an upper level and a lower level, the peripheral ring being made of a material that is rigid at the treatment temperature, and
    a step of forming the bonding layer, said layer filling the central cavity once the assembly has been formed.

2. The method according to claim 1, wherein the step of producing is carried out such that, once the assembly has been formed, said bonding layer extends above the upper level of the peripheral ring over the entire bonding face having the central cavity and the peripheral ring.

3. The method according to claim 1, wherein the step of producing comprises thinning of a central part of one of either the substrate of interest or the handle substrate.

4. The method according to claim 1, wherein the step of producing comprises depositing a band of said rigid material on a peripheral part of one of either the substrate of interest or the handle substrate.

5. The method according to claim 1, wherein the step of producing comprises forming a layer of said rigid material on one of either the substrate of interest or the handle substrate and thinning a central part of the layer of said rigid material.

6. The method according to claim 1, wherein the peripheral ring has a width that corresponds to at least 2.5%, preferably at least 5%, of a diameter of the bonding face of the substrate of interest.

7. The method according to claim 1, wherein the rigid material has a Young's modulus greater than 1 MPa.

8. The method according to claim 1, further comprising a step of trimming a peripheral part of the substrate of interest.

9. The method according to claim 1, further comprising, after the step of forming the assembly, a step of thinning the substrate of interest and a step of separating the handle substrate from the thinned substrate of interest.

\* \* \* \* \*